United States Patent [19]
Martens et al.

[11] Patent Number: 4,952,984
[45] Date of Patent: Aug. 28, 1990

[54] DISPLAY DEVICE INCLUDING LATERAL SCHOTTKY DIODES

[75] Inventors: Jan W. D. Martens; Karel E. Kuijk, both of Eindhoven, Netherlands

[73] Assignee: U.S. Philips Corporation, New York, N.Y.

[21] Appl. No.: 250,008

[22] Filed: Sep. 27, 1988

[30] Foreign Application Priority Data

Oct. 19, 1987 [NL] Netherlands .................... 8702490

[51] Int. Cl.$^5$ .................... H01L 27/12; H01L 29/48
[52] U.S. Cl. .................................. 357/15; 357/4; 350/334
[58] Field of Search .................... 357/4, 15; 350/334

[56] References Cited

U.S. PATENT DOCUMENTS

| | | | |
|---|---|---|---|
| 4,223,308 | 9/1980 | Baraff et al. | 350/334 |
| 4,732,873 | 3/1988 | Perbet et al. | 357/15 |
| 4,820,024 | 4/1989 | Nishimura | 350/334 |

FOREIGN PATENT DOCUMENTS 58-17680 2/1983 Japan .................................. 357/15

*Primary Examiner*—Jerome Jackson, Jr.
*Attorney, Agent, or Firm*—John C. Fox

[57] ABSTRACT

In a display device including active switching units, lateral Schottky diodes are used as switching elements. In the lateral Schottky diodes a sub-micron distance between the Schottky electrode and the opposing electrode contacting the semiconductor body is obtained by anodising the Schottky metal and subsequently doping the exposed portion of the semiconductor body, for example, by implantation.

10 Claims, 4 Drawing Sheets

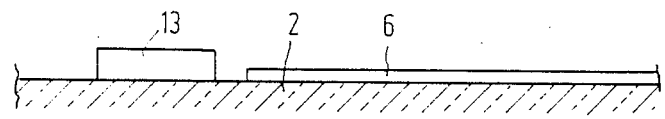
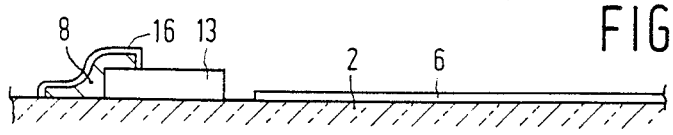
FIG. 3a
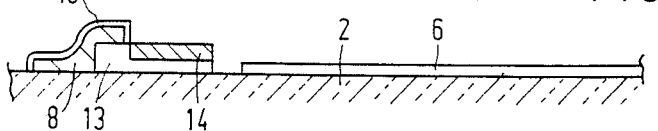
FIG. 3b
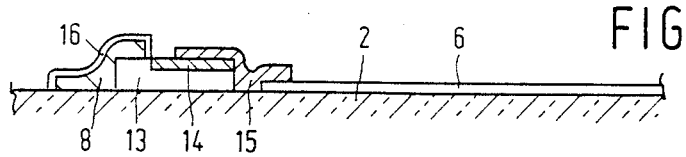
FIG. 3c
FIG. 3d
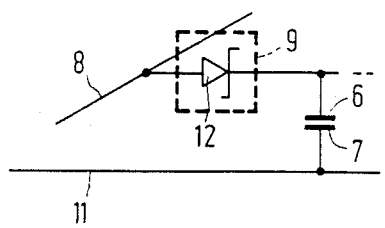
FIG. 4

DISPLAY DEVICE INCLUDING LATERAL SCHOTTKY DIODES

BACKGROUND OF THE INVENTION

The invention relates to a display device comprising an electro-optical display medium between two supporting plates, a system of picture elements arranged in rows and columns, each picture element being constituted by two picture electrodes arranged on the facing surfaces of the supporting plates, a system of row and column electrodes for driving the picture elements, the row electrodes being arranged on the one supporting plate and the column electrodes being arranged on the other supporting plate, and a system of switching elements in which a switching unit including at least one Schottky diode as a switching element is arranged in series with each picture element between a row and a column electrode.

In this respect it is to be noted that the terms row electrode and column electrode in this Application may be interchanged, if desired, so that a column electrode can be a row electrode while simultaneously a row electrode can be a column electrode.

A display device of this type is suitable for the display of alphanumerical and video information by means of passive electro-optical display media such as liquid crystals, electrophoretic suspensions and electrochromic materials.

The known passive electro-optical display media generally have an insufficiently steep transition characteristic with respect to the applied voltage and/or they have an insufficient intrinsic memory. As a result of these properties the number of lines to be driven is small in multiplexed matrix display devices. Owing to the lack of memory the information presented to a selected row electrode via the column electrodes must be written over and over again. Moreover, the voltages presented to the column electrodes are not only present across the picture elements of a driven row electrode but also across the picture electrodes of all other rows. Consequently, picture elements undergo an effective voltage during the period when they are not driven, which voltage may be sufficient to bring a picture element to the on-state. With an increasing number of row electrodes the ratio of the effective voltage undergone by a picture element in the on or the off-state decreases. The lack of a sufficiently steep transition characteristic consequently causes the contrast between picture elements in the on and off-states to decrease.

It is known that the number of rows to be driven may be increased by providing an extra switch for each picture element. This switch provides for a sufficient threshold with respect to the applied voltage and it ensures that the information presented to a driven row electrode remains available across a picture element during the period when the other row electrodes are driven. The switch also prevents a picture element from undergoing an effective voltage during the period when it is not driven.

A display device of the type mentioned in the opening paraagraph is described in British Patent GB 2,129,183 A. This patent describes the use of Schottky diodes as switches. These have various advantages over semiconductor pn diodes, such as a higher current density, more rapid switching times and smaller crosstalk, which results in a high resolution of the display device. The Schottky diodes referred to in this patent have a vertical structure comprising a layer of amorphous silicon between two metal layers constituting a Schottky contact (anode) and an ohmic contact (cathode), respectively, where the ohmic contact is a highly doped silicon layer.

A drawback of such a Schottky diode is that the layer of amorphous silicon has a high resistivity. This resistivity cannot be decreased by doping the semiconductor material because the cathode contact then no longer functions as a Schottky contact. Moreover, a second drawback is the presence of so-called "pin holes" which in the amorphous silicon layer, may be filled up by a metal contact layer and may thus cause short circuits between cathode and anode. This risk will be considerably greater if the semiconductor layer is made thinner in order to decrease the resistance between cathode and anode.

Other drawbacks are that such diodes cover a relatively large surface area due to alignment tolerances. Consequently, they have a high capacitance which increases the crosstalk to a considerable extent. Leakage currents also often occur along the periphery, which necessitates an additional passivation step.

OBJECT AND SUMMARY OF THE INVENTION

It is an object of the invention to obviate the above-mentioned drawbacks to a substantial extent by providing a different structure of the Schottky diode which can also be manufactured in a simpler manner.

The invention is based on the recognition that the influence of possible "pin holes" is substantially negligible if they are substantially perpendicular to the current direction.

A display device according to the invention is therefore characterized in that the Schottky diode constitutes a lateral diode. This Schottky diode is preferably realised in a single layer of semiconductor material.

In such a structure the short circuits between anode and cathode contacts due to "pin holes" being filled up can no longer occur. Moreover, much smaller Schottky diodes can be manufactured so that the influence of the diode capacitance and hence the crosstalk is smaller. The distance between anode and cathode may be chosen to be, for example, smaller than 1 $\mu$m. The layer thickness of the semiconductor material may also be chosen to be very small (for example, smaller than 1 $\mu$m), which is favourable for display devices in which the liquid crystal layer has a small thickness.

The diodes thus obtained can be used in various types of switching units such as, for example, a circuit of two diodes constituting a so-called diode ring.

A method of manufacturing a display device according to the invention comprises the steps of: photolithographically providing picture electrodes and semiconductor regions on a first supporting plate; subsequently at least locally covering the semiconductor regions photolithographically with a metal layer which constitutes a Schottky barrier with the semiconductor material; providing an insulation layer on the metal layer at least at the area of a lateral Schottky diode to be formed; and providing an electrically conducting contact on the semiconductor material, with the metal thus insulated serving as a mask. For the conducting contact the semiconductor body may be doped with impurities, for example, by means of ion implantation.

BRIEF DESCRIPTIONS OF THE DRAWINGS

The invention will now be described in greater detail by way of example with reference to the accompanying drawings in which FIG. 1 is a diagrammatic plan view of part of a display device according to the invention;

FIG. 2 is a diagrammatic cross-section taken on the line II—II in FIG. 1,

FIGS. 3a–d show diagrammatic cross-sections during various stages of manufacturing a device as shown in FIG. 1.

FIG. 4 is a schematic diagram for one picture element of the device of FIG. 1.

The Figures are diagrammatic and not to scale. Corresponding elements are generally denoted by the same reference numerals.

DESCRIPTION OF THE PREFERRED EMBODIMENTS

Figure 1:
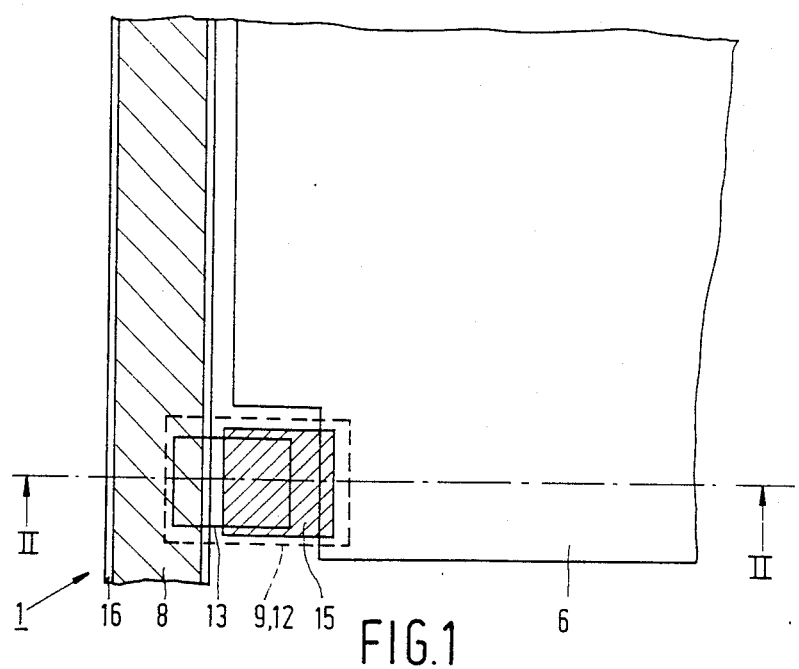
Figure 2:
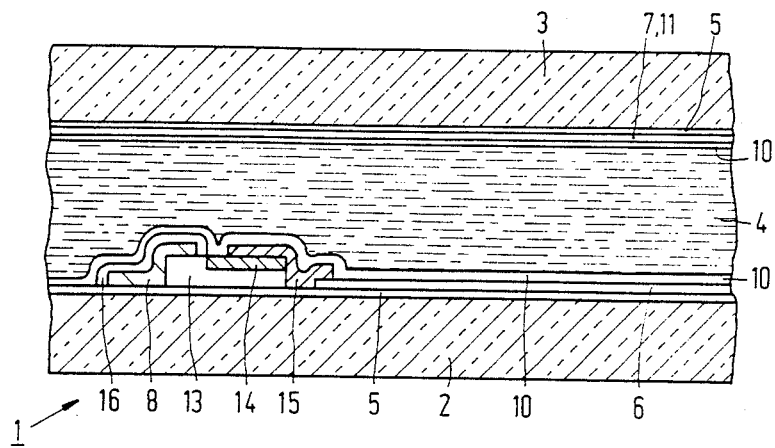

FIGS. 1 and 2 show in a plan view and in a cross-section, respectively, a part of a display device 1 comprising two supporting plates 2 and 3 between which a liquid crystal 4 is present. In this example the inner surface of the supporting plates 2 and 3 have electrically and chemically insulating layers 5. A large number of picture electrodes 6 and picture counter electrodes 7 arranged in rows and columns respectively, are provided on the supporting plates 2 and 3. The facing picture electrodes 6 and 7 constitute the picture elements of the display device. Advantageously, the picture electrodes 7 may be integrated to form strip-shaped row electrodes 11. Strip-shaped column electrodes 8 are provided between the rows of picture electrodes 6. Each picture electrode 6 is connected to a column electrode 8 by means of a switching element 9 shown diagrammatically in FIG. 1, in this example a Schottky diode. The switching elements 9 provide the liquid crystal 4 with a sufficiently steep transition characteristic with respect to the applied voltage and provide the liquid crystal 4 with a memory. Liquid crystal orienting layers 10 are provided on the inner surfaces of the supporting plates 2 and 3. As is known, a different orientation state of the liquid crystal molecules and hence an optically different state can be obtained by applying a voltage across the liquid crystal layer 4. The display device may be in the form of a transmissive or reflective device and may be provided with colour filters.

According to the invention, the switching element in this example comprises a lateral Schottky diode 12 formed from a layer 13 of semiconductor material, in this example a layer of amorphous silicon having a thickness of approximately 0.5 $\mu$m. The column electrode 8 is made of tantalum or another metal such as, for example, molybdenum or chromium, and constitutes a Schottky barrier anode where it contacts the amorphous silicon. At least in the region of contact, this amorphous silicon layer is undoped, which in practice implies a light n-type doping ($<10^{18}$ atoms/cm$^3$).

For the cathode contact, the layer of amorphous silicon has an n+ region 14 (contact zone) having a high impurity concentration (approximately $10^{21}$ atoms/cm$^3$). A layer 15 of, for example, molybdenum or other suitable metal connects the cathode region 14 of the diode to the picture electrode 6.

The exposed surface of the Schottky metal is provided with a thin layer 16 of an insulating material, in this case tantalum oxide, which determines the distance between the Schottky contact and the region 14, or in other words between anode and cathode of the Schottky diode 12, along the surface of the semiconductor layer 13. This distance is approximately 0.5 $\mu$m.

One advantage of such a construction is that the current direction is now substantially perpendicular to the longitudinal axis of possible "pin holes". Moreover, smaller diodes can be realised so that the capacitance effects are smaller and thus greater speeds can be achieved.

Since anode and cathode contacts are no longer arranged vertically with respect to each other, a short circuit cannot arise due to possible vertically oriented "pin holes" being filled up. Furthermore, no additional passivation step is necessary. Such a lateral device structure is also found to be advantageous because no critical masking steps are required for its manufacture.

The manufacture of such a device will now be described with reference to FIGS. 3a–d.

A supporting plate 2 is coated with a layer of electrode material, for example, (translucent) indium tin oxide, which is subsequently patterned by means of photolithography and an etching process so that electrodes 6 are formed. Similarly, semiconductor regions 13 of, for example, amorphous silicon are formed (FIG. 3a) on the supporting plate 2.

Subsequently, tantalum or another suitable material is deposited and patterned by way of photolithography and an etching process to form column electrodes 8, which partly cover the semiconductor regions 13, where they constitute Schottky contacts. These electrodes 8 are then provided with a layer of insulating material 16; tantalum oxide having a thickness of approximately 0.5 $\mu$m by, for example, anodization of the tantalum (FIG. 3b). Anodising is effected in, for example, a bath containing citric acid, while a voltage is applied to the electrodes 8. For this purpose, the ends of the column electrodes 8 may be interconnected temporarily.

The parts of the semiconductor regions 13 not covered by tantalum or tantalum oxide are subsequently subjected to an ion implantation, denoted by arrows 17 in FIG. 3c, for example, by phosphorus ions having an energy of 30 keV and an implantation dose of $10^{16}$ atoms/cm$^2$, whereafter an annealing step at approximately 200° C. takes place, whereby the contact zones 14 are produced.

In a subsequent step the electrodes 6 and the Schottky diodes are interconnected. To this end the device is coated with one or more layers of a conducting material, for example, molybdenum and/or aluminum, after which tracks 15 are formed by way of photolithography and an etching process resulting in the device of FIG. 3d.

The picture display device is completed by conventionally arranging a second supporting plate 3 provided with column electrodes 7, 11 opposite the supporting plate 2 and by sealing the periphery of the device, whereafter the device is filled with liquid crystal material 7 via an inlet in the seal.

The electrical equivalent of a single picture element and the associated switching element 9 consisting of the Schottky diode 12 of FIG. 3 is shown in FIG. 4.

Figure 5:
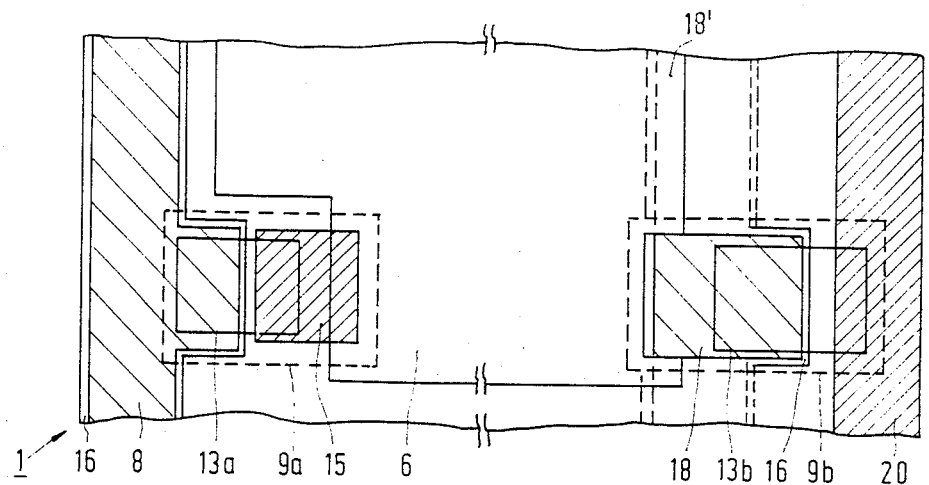
FIG. 5 is a diagrammatic plan view of another display device according to the invention.
Figure 6A:
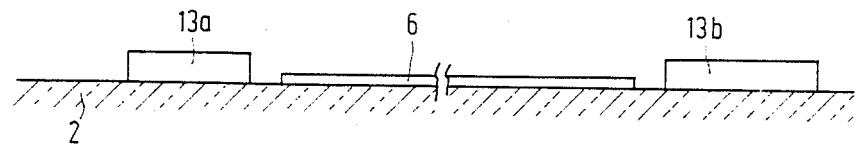
FIGS. 6a–6c are diagrammatic cross-section during various stages of manufacturing this device.
Figure 6B:
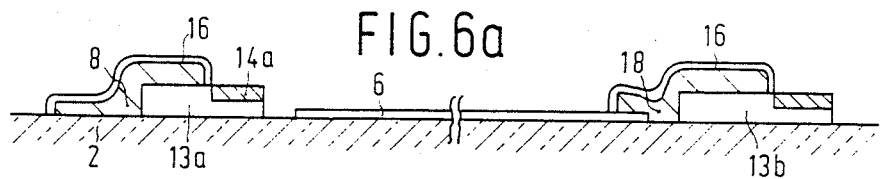
Figure 6C:
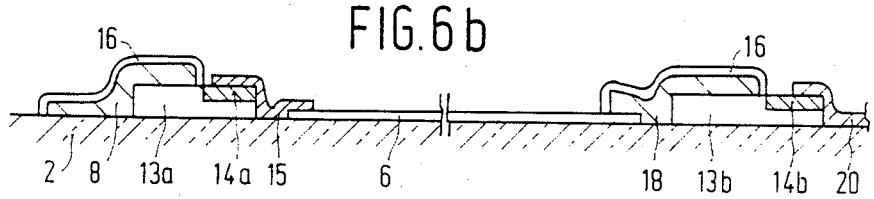

Referring now to FIGS. 5 and 6, the switching units 9a, 9b are manufactured in a substantially analogous manner to unit 9 of FIGS. 1-3. Since the tantalum layer 18 is not accessible via a column electrode in the ultimate configuration, an auxiliary electrode 18' is temporarily provided for the purpose of anodisation, which electrode is removed by means of a coarse auxiliary mask after anodisation.

The second column electrode 20 can be provided simultaneously with metal tracks 15. The other reference numerals have the same meaning as those in FIGS. 2 and 3.

Figure 7:
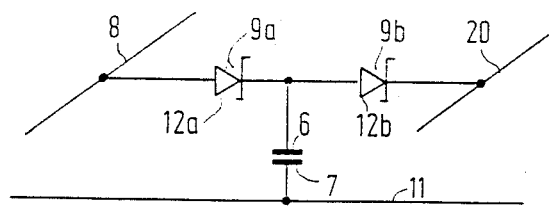
FIG. 7 is a schematic diagram for one picture element of this device.

The circuit thus obtained for display devices, a substitution diagram of which is shown in FIG. 7, is described in U.S. Pat. No. 4,811,006 (PHN 11,508) in the name of the Applicant. The column electrode 20 may also be used, for example, for presenting a reference voltage.

Figure 8A:
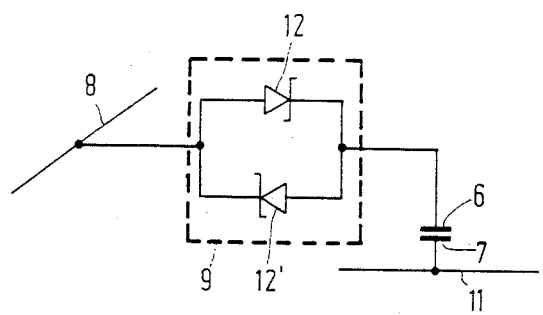
FIGS. 8a–c are schematic embodiments of device of the invention.
Figure 8B:
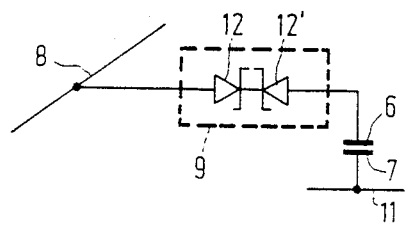
Figure 8C:
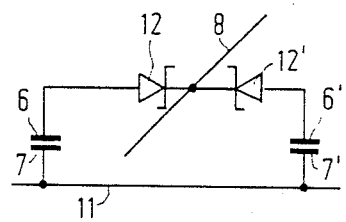

The invention is of course not limited to the embodiments shown. Other switching units can be realised such as, for example, diode rings (FIG. 8a) or the switching units shown in FIGS. 8b and 8c.

For the anodisation step an auxiliary electrode may be provided temporarily, which electrode is removed after anodisation. Metal parts to be anodized are not always connected to a common conductor.

In some cases this auxiliary electrode may form part of the ultimate tantalum configuration; in FIG. 5 this can be achieved, for example, by choosing the auxiliary electrode 18' to be so narrow that the translucent properties of the picture electrodes 6 are not affected.

The semiconductor regions 13 need not be manufactured of one material, but if necessary an intermediate layer of a semiconductor material may be provided between the substrate and the actual Schottky diode.

The manufacturing method may also be performed in accordance with several variations. For example, the ohmic contact of the Schottky diode may also be obtained by providing a structured layer of n+ monocrystalline silicon by means of photolithographic techniques, which layer covers the amorphous silicon at the location of the contact.

What is claimed is:

1. A display device comprising an electro-optical display medium between two supporting plates, a system of picture elements arranged in rows and columns, each picture element being defined by two picture electrodes arranged on facing surfaces of the supporting plates, a system of row and column electrodes for driving the picture elements, and a system of switching units, each unit including at least one Schottky diode and each unit arranged in series with a picture element between a row and a column electrode, characterized in that the Schottky diode is a lateral diode comprising a layer of semiconductor material, a Schottky barrier cathode layer on the semiconductor layer, and insulating layer covering the cathode layer, and an anode, the anode separated from the cathode by a distance on the surface of the semiconductor layer equal to the thickness of the insulating layer.

2. A display device as claimed in claim 1, characterized in that the layer of semiconductor material has a thickness of at most 1 $\mu$m.

3. A display device as claimed in claim 1, characterized in that the distance between the cathode and the anode of the Schottky diode is at most 1 $\mu$m.

4. A display device as claimed in claim 1, characterized in that the picture element is connected to a second electrode via a further Schottky diode.

5. A display device as claimed in claim 4, characterized in that the second electrode is a column electrode for presenting information to be displayed.

6. A display device as claimed in claim 4, characterized in that the second electrode is used for presenting a reference voltage.

7. A display device as claimed in claim 1, characterized in that each switching unit comprises two Schottky diodes arranged in parallel and biased in different directions.

8. A display device as claimed in claim 1, characterized in that the semiconductor material is amorphous silicon.

9. A display device as claimed in claim 8, characterizes in that the Schottky contact of the Schottky diode comprises one of the metals selected from the group consisting of tantalum, aluminum, molybdenum and chromium.

10. A display device as claimed in claim 1, characterized in that the electro-optical display medium is selected from the group consisting of a liquid crystal, an electrophoretic suspension, and an electrochromic material.

* * * * *